United States Patent

Seelbach et al.

[15] 3,706,130

[45] Dec. 19, 1972

[54] VOLTAGE DISTRIBUTION FOR INTEGRATED CIRCUITS

[72] Inventors: Walter C. Seelbach, Scottsdale, Ariz.; Kyriakose Lampathakis, Lake Park, Fla.

[73] Assignee: Motorola, Inc., Franklin Park, Ill.

[22] Filed: July 13, 1970

[21] Appl. No.: 61,039

Related U.S. Application Data

[60] Continuation-in-part of Ser. No. 610,915, Jan. 23, 1967, abandoned, Division of Ser. No. 683,078, Oct. 30, 1967, Pat. No. 3,581,165.

[52] U.S. Cl. ....................................29/584, 29/576

[51] Int. Cl. ............................................B01j 17/00

[58] Field of Search .......29/576; 29/584; 317/235 D, 317/235 E

[56] References Cited

UNITED STATES PATENTS

| | | | |
|---|---|---|---|
| 3,387,193 | 6/1968 | Donald | 317/235 |
| 3,395,320 | 7/1968 | Ansley | 317/235 X |

*Primary Examiner*—John F. Campbell
*Assistant Examiner*—W. Tupman
*Attorney*—Mueller and Aichele

[57] ABSTRACT

A voltage distribution system formed in a monolithic integrated circuit structure and a process for making same. Adjacent P-type and N-type conductivity semiconductor layers form respective portions of separate conductive paths for distributing electrical potentials to semiconductor devices or other components within the same integrated structure. P-type and N-type channels are formed within various portions of the semiconductor layers to complete the conductive paths, and reverse biased junctions electrically isolate the conductive paths and prevent electrical interference between same.

3 Claims, 7 Drawing Figures

VOLTAGE DISTRIBUTION FOR INTEGRATED CIRCUITS

RELATED APPLICATIONS

This application is a continuation in part of application Ser. No. 610,915 filed Jan. 23, 1967, now abandoned. This is a division of application Ser. No. 683,078, filed Oct. 30, 1967, now U.S. Pat. No. 3,581,165.

This invention relates generally to electronic voltage distribution systems and more particularly to such systems formed as a monolithic integrated semiconductor structure and adapted to distribute electrical potentials via the semiconductor materials of the integrated circuit. The terms "system" and "integrated circuit" are used interchangeably herein since the operative integrated circuit according to this invention is also a voltage distribution system. By using individual layers of semiconductor material forming part of a monolithic integrated circuit as the transmission paths for electrical potentials therein, supply or signal voltages are made available at selected locations within the integrated circuit. Thus, the present system does not require complex layers of surface metallization or separate layers of insulation to prevent adverse electrical interference between transmission paths.

BACKGROUND OF THE INVENTION

In the past, it has been necessary to use relatively complex patterns of metallization in order to distribute voltages from a source of electrical potential to one or more distant surface areas of a monolithic integrated circuit. One such prior art technique for distributing voltages within a monolithic integrated circuit involves first depositing or growing an insulating material, such as silicon dioxide, on the surface of a layer of silicon in which various devices or components are formed using known monolithic integrated circuit construction techniques. Using well known masking and etching steps in the art of photolithography, it is possible to extend metallization patterns from a source voltage and over the surface of the silicon dioxide to a particular transistor or other electronic component within the integrated circuit. In this manner, various bias voltages are connected to integrated transistor circuits. Using the surface coating of silicon dioxide as described above, the various PN junctions which terminate at the surface of a monolithic semiconductor chip can be passivated and insulated from the electrical potentials on the metallization patterns which distribute electrical potentials to various points within the integrated circuit.

The above-described method of depositing metallization patterns over insulating coatings on the surface of an integrated circuit has many advantages over other known wiring techniques, and such method is most certain to receive extensive future use. However, there are many integrated circuit applications where it is preferred not to use the above-mentioned complex metallization patterns on the surface of or within a monolithic integrated circuit but nevertheless have certain electrical potentials available at various points within the circuit which are used to energize or control transistors or other active or passive components within an integrated circuit. The present invention is directed toward eliminating the cost and complexity of those types of integrated circuits in which extensive metallization and insulation are used.

SUMMARY OF THE INVENTION

An object of this invention is to provide a new and improved voltage distribution system and process for making same in which electrical potentials are provided at selected points within a monolithic semiconductor circuit structure using a minimum of metallization and electrical wiring.

Another object of this invention is to provide a voltage distribution system in the form of a monolithic integrated circuit in which the availability of signal and supply voltages throughout the integrated circuit has been substantially enhanced. Semiconductor layers of an integrated structure which are necessary to support other portions of a monolithic structure in which the actual integrated circuits are built and constructed in a manner to form the electrical potential distribution paths of the system.

Briefly described, this invention includes a monolithic integrated circuit structure wherein the P-type and N-type conductivity semiconductor layers which form a monolithic integrated semiconductor chip are constructed and biased in such a manner that enables these layers to serve as voltage distribution paths. These paths extend from sources of electrical potential to selected points within the integrated circuit structure. The PN junctions formed by layers of P-type and N-type semiconductor material are reverse biased in order that electrical isolation is maintained throughout the system structure, and known individual epitaxial and diffusion process steps are used to form P-type and N-type semiconductor channels within the monolithic chip. These channels complete the above conductive paths and bring supply or signal voltages to preselected points on a surface of the chip. Thus, a voltage distribution path of the system will include adjacent layers and channels of like conductivity type semiconductor material.

DESCRIPTION OF THE PREFERRED EMBODIMENTS

Figure 1:
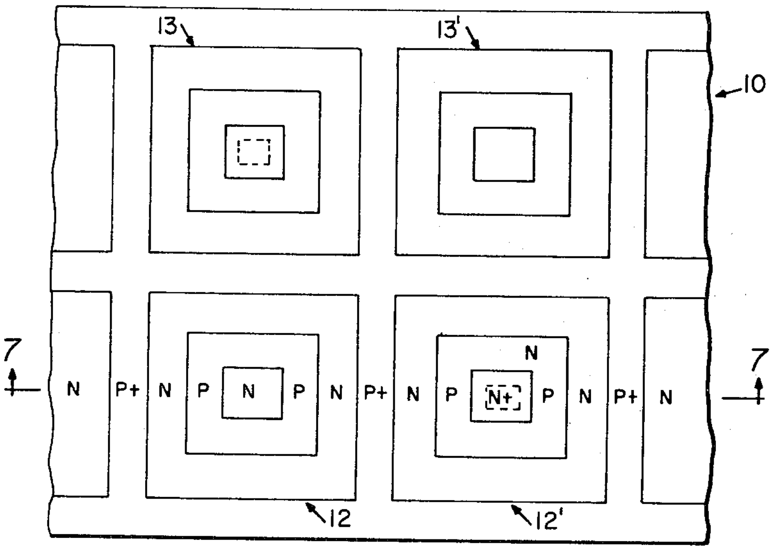
FIG. 1 is a plan view of the monolithic integrated voltage distribution system according to this invention.

Referring in detail to the accompanying drawing, there is shown in FIG. 1 a plan view of the monolithic integrated voltage distribution system built according to this invention. FIG. 1 illustrates only four of the many hundreds of semiconductor devices which may be constructed in an electronic circuit in monolithic form using integrated semiconductor circuit construction techniques. FIG. 1 illustrates four transistors 12, 12' and 13, 13' which are electrically isolated using PN junction reverse biasing as will be explained below in more detail. The integrated circuit illustrated in plan view in FIG. 1 will become better understood upon consideration of the following novel combination of epitaxial and diffusion process steps described with reference to FIGS. 2 through 7.

Figure 2:
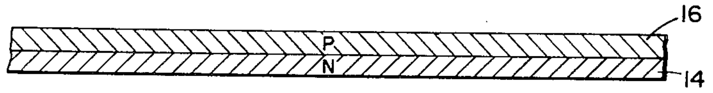
FIGS. 2 through 7 illustrate intermediate structures formed by the epitaxial and diffusion process steps which are used in constructing this system.
Figure 3:
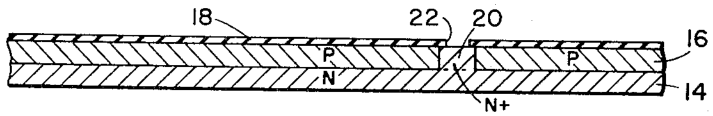

In FIG. 2 there is shown a first layer 14 of one conductivity (N-type) semiconductor material upon which has been epitaxially grown a second layer 16 of opposite conductivity (P-type) semiconductor material. The terms "layer," "region," "semiconductor body" and the like are used interchangeably when referring to various portions of FIGS. 2 to 7.

Once the opposite conductivity type second layer 16 has been formed on the N-type layer 14, a layer of silicon dioxide 24 (FIG. 3) is formed on the surface of the P-type layer 16 and thereafter an opening 22 is etched therein using known photolithographic techniques. When the opening 22 has been etched in the oxide layer 24, an N-type channel portion 20 is diffused through the P-type layer 16, and this channel portion 20 or "plug" to which the channel type diffusion is sometimes referred extends through the P-type layer 16 and into substrate layer 14. Prior to carrying out any of the process steps which will be described with reference to FIG. 4, the silicon dioxide coating 24 is removed from the surface of the P-type layer 16.

Figure 4:
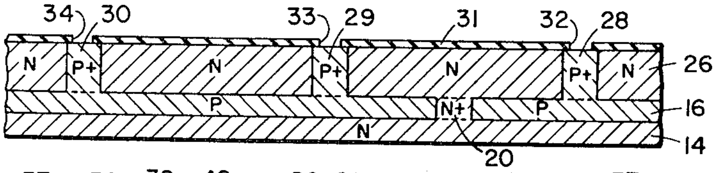

Referring to FIG. 4, a third layer 26 of the one conductivity (N) type material has been formed on the surface of the P-type layer 16, and such formation may be carried out by using a well known epitaxial growth process. Once the third or N-type layer 26 has been formed, a second silicon dioxide coating 31 is grown or deposited thereon and openings 32, 33 and 34 are thereafter etched through this oxide coating in a manner previously described with reference to opening 22 in FIG. 3.

Once the openings 32, 33 and 34 have been etched in the silicon dioxide coating 34 as shown in FIG. 4, P-type conductivity channel portions 28, 29 and 30 are diffused through the oxide openings 32, 33 and 34 respectively using well known diffusion techniques. These plugs or channel portions 28, 29 and 30 of P-type semiconductor material extend to the surface of the second or P-type layer 16 and in integral relationship therewith.

From an examination of the semiconductor structure in FIG. 4 of the drawing, it can be seen that the N-type and P-type layers and channel portions of the structure form continuous N-type and P-type conductive paths from the lower portions (layers 14 and 16) of the monolithic chip to the upper surface of the N-type layer 26. Consequently, if the N-type and P-type portions of the monolithic structure in FIG. 4 are reverse biased, then electrical potentials may be applied to the N-type and P-type layers 14 and 16 in order to bring these potentials to the surface of the N-type layer 26. By making electrical potentials available at selected points on the surface of the epitaxial layer 26, semiconductor devices and integrated circuits which are subsequently formed in the N-type epitaxial layer 26 may be readily biased with appropriate electrical potentials and the necessity for complex metallization patterns for applying these potentials can be eliminated.

When the semiconductor layers and channels described with respect to the structure shown in FIG. 4 are used to distribute power supply voltages and current to various functional devices within the monolithic integrated circuit, then the capacitance of the junction between the N-type and P-type regions 14 and 16 should be large. This large distributed capacitance is especially important when the integrated circuit functional devices are utilized in high frequency applications. As shown in the drawing, the reverse biased junction between the N-type and P-type regions 14 and 16 is coextensive with the monolithic integrated circuit providing distributed decoupling capacitance throughout. Heavier doping in the N-type and P-type regions 14 and 16 increases the capacitance of the reverse biased junction therebetween. The distribution of power through the P-type and N-type regions 14 and 16 can be compared to power distribution through a very low impedance transmission line system wherein the N-type region 16 is one conductive plane and the P-type region 14 is a second conductive plane of the system. The distributed capacitance of the reverse biased junction forms not only the electrical isolation in such plane-type transmission system but also the decoupling capacitance for the DC power supply. With large junction areas, the characteristic impedance of such an integrated transmission system is low, such being desirable for power supply distribution systems. Regions 14 and 16 have low resistivities (low series impedance) for reducing DC power dissipation therein. Such regions are connected through channel regions 28, 29, 30 and 20, 21 (FIG. 7) to the one main surface thereon for supplying DC power thereto.

If a signal voltage is to be conducted via the various semiconductor layers and channels described above to the surface of the structure shown in FIG. 4, then restrictions will be placed on the maximum signal frequency and the capacitance between the N-type and P-type regions. The maximum signal frequency and capacitance must be maintained at values such that the capacitive reactance $X_c = 1/(2\pi f_C)$ is sufficiently large to insure that any AC coupling between adjacent N-type and P-type regions is negligible.

Once the structure in FIG. 4 is complete, then devices are formed within the N-type third layer 26 using known individual photolithographic process steps in a novel process combination for completing the integrated circuit.

Figure 5:
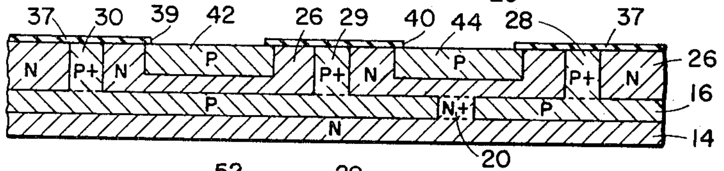

For purposes of illustration and with reference to FIGS. 5 through 7, the NPN transistors 12 and 12′ which have been constructed in the upper portions of the N-type layer 26 will be described in relation to the voltage distribution system of this invention. After first regrowing a silicon dioxide coating 37 (see FIG. 5) over the etched openings 32, 33 and 34 and over the oxide coating 31 in FIG. 4, openings 39 and 40 are etched in the oxide coating 37 and the P-type regions 42 and 44 are selectively diffused into the N-type layer 26 in order to form the base regions of the NPN transistors 12 and 12′.

Figures 6, 7:
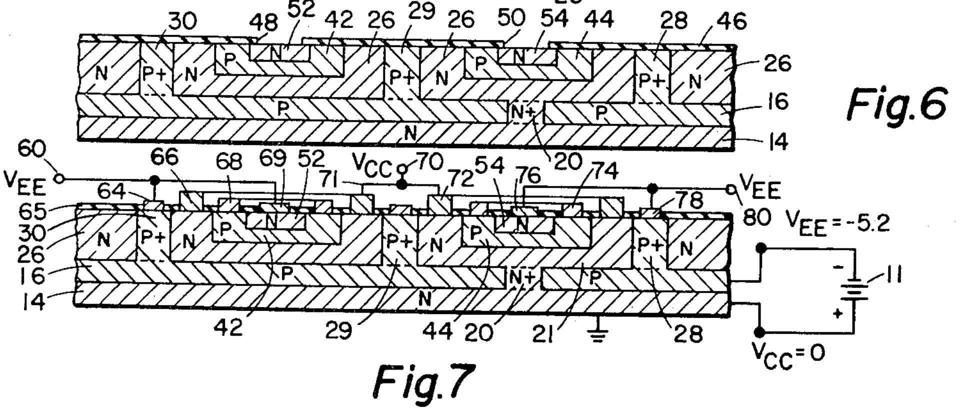

When these P-type diffusions have been made to convert the N-type epitaxial layer 26 from N-type to P-type material in regions 42 and 44, a silicon dioxide layer 46 is regrown over the entire surface of the wafer shown in FIG. 5 and openings 48 and 50 are subsequently etched therein as shown in FIG. 6. These openings 48 and 50 are provided for the diffusion of the N-type emitter regions 52 and 54, respectively.

When the N-type emitter regions 52 and 54 have been diffused into the upper epitaxial layer 26 as shown in FIG. 6, additional openings are selectively etched in the oxide coating 46 for receiving metal contact and the passivating oxide coating 46 is left over the various PN junctions at their point of termination at the surface of the structure in FIG. 7. As is well known in the semiconductor device and integrated circuit technology, the silicon dioxide coating passivates the PN junctions at the point of surface termination and reduces reverse breakdown tendency, i.e., increases the surface avalanche voltage for the various PN junctions shown.

For purposes of illustration only, the above-described sequence of process steps has been described with reference to the formation of NPN transistors in the areas adjacent the surface of a monolithic semiconductor chip. However, it will be appreciated by those skilled in the art that the voltage distribution system and process according to the present invention are equally applicable to the construction of complex monolithic integrated circuits. The NPN transistors shown topographically in FIG. 1 are merely four of possible hundreds of transistors and other semiconductor circuit components which lend themselves to the utilization of the voltage distribution scheme described above in the art of monolithic integrated circuit construction.

Referring again to FIG. 7, assume now that it is desired to bias the two NPN transistors 12 and 12' for current mode operation. Typical bias voltages for current mode operation are a zero volt collector potential and a −5.2 volt emitter potential. These potentials are made available in the circuit of FIG. 7 by a battery 11 having its negative terminal connected to the P-type layer 16 and its positive terminal grounded and connected to the N-type substrate region 14. The biasing arrangement in FIG. 7 reverse biases the P and N-type layers 16 and 14 respectively as well as the N-type channel portion 20 with respect to the P-type layer 16. The P-type columns or channels 28, 29 and 30 are also reverse biased with respect to the surrounding N-type layer 26. With the N-type and P-type columns and regions of FIG. 7 heavily doped, the voltage drops within the various semiconductor regions can be maintained at relatively low values, and the emitter potential $V_{EE}$ and collector potentials $V_{CC}$ (minus the low resistance losses in the semiconductor materials) are available at the surface of the structure shown in FIG. 7.

The zero volt collector potential $V_{CC}$ is conducted from the substrate region 14, through the N+ channel portion 20 and through the N-type collector region 21 of the epitaxial layer 26 to a metal ohmic contact 72 at the surface of the monolithic chip. The metal contact 72 now establishes a $V_{CC}$ collector potential at terminal 70, and this collector potential is applied via conductor 71 to collector contact 66 for a transistor 12. Therefore, it is seen that the collector region 21 of transistor 12' serves as both a collector region for that transistor as well as a means for bringing the collector potential $V_{CC}$ to the surface of the chip.

The emitter potential $V_{EE}$ of −5.2 volts is brought to the surface of the chip from the P-type region 16 and through the P+ columns 28, 29 and 30. The metal contacts 64, 65 and 78 on the surface of the chip make readily available an emitter potential for regions 52 and 54 of the two transistors 12 and 12' as well as transistors 13 and 13'. The emitter potential $V_{EE}$ at terminal 60 is conductively applied to emitter contact 69 for transistor 12, and the emitter potential $V_{EE}$ at terminal 80 is applied to emitter contact 76 for transistor 12'.

Another $V_{EE}$ surface contact 65 which is connected to the center P+ column 29 is not needed for biasing the two transistors 12 and 12', but this contact 65 may be used for biasing other adjacent transistors (not shown).

A signal voltage may be applied to the base contacts 68 and 74 for transistor 12 and 12', respectively, but the additional circuitry for applying an electrical potential to the base contacts 68 and 74 is not necessary for purposes of illustrating the present invention.

It will be appreciated by those skilled in the art that the individual process steps described with reference to FIGS. 2 through 6 are per se known in the art of photolithography. However, applicants have combined individually known process steps in a novel process combination in order to form the novel distribution system illustrated in cross section in FIG. 7.

The system of FIG. 7 can be extended to include other voltage distribution paths which are electrically isolated as are the paths shown in FIG. 7. However, such logical extensions of FIG. 7 to provide multiple conductive paths for complex integrated circuits will be appreciated by those skilled in the art of integrated circuit construction.

We claim:

1. A process for forming a voltage distribution system to provide conductive paths within a multilayer chip of semiconductor material, the conductive paths consisting of portions of said multilayer chip which are biased in such a manner that no undesirable electrical interference occurs between adjacent portions of the layers of the multilayer chip which are used to distribute voltages, said method comprising:

a. providing a substrate of one conductivity type semiconductor material;

b. forming a second region of opposite conductivity type semiconductor material adjacent said substrate;

c. forming a channel portion within said second region of said one conductivity type semiconductor material, said channel portion formed integral with said first region of one conductivity type semiconductor material and adapted to be reverse biased with respect to said second region of semiconductor material so that the electrical potential of said second region does not adversely interact with the electrical potential on said channel portion or the electrical potential on said first region, d. forming a third region of said one conductivity type semiconductor material adjacent said second region and in electrical connection and integral with said channel portion of said one conductivity type within said second region of semiconductor material, said third region being adapted to be reverse biased with respect to said second region so that the electrical potential on said second region does not adversely interact with the electrical potential on said third region, said first and third regions and channel portion all being of said one conductivity type semiconductor material and thereby providing a continuous path for voltage distribution from said first region to the surface of said third region and making available at the surface of said third region an electrical potential, and e. applying electrode means to said first and second regions for applying a voltage to and reverse biasing said first and third regions and said channel portion with respect to said second region, whereby said first, second and third regions and said channel portions are utilized as voltage transmission paths between a DC supply voltage connectable to said electrode means and semiconductor devices and integrated circuits fabricated within said third region.

2. The process according to claim 1 which further includes:

a. forming a second channel portion of said opposite conductivity type semiconductor material wholly within said third region and in electrical contact with said second region, and b. reverse biasing said second channel portion with respect to said third region for providing electrical isolation between said second channel portion and said third region for permitting the distribution of electrical potentials from said second region and through said second channel portion to the surface of a multilayer monolithic integrated circuit structure.

3. The process according to claim 2 wherein:

a. said forming said second region includes epitaxially growing a P-type layer of semiconductor material upon an N-type substrate layer of semiconductor material, b. said forming said channel portion within said second region includes diffusing an N+ channel portion through said P-type layer of semiconductor material and in integral relation with said N-type substrate layer.

c. said forming said third region includes epitaxially growing an N-type layer of semiconductor material upon said P-type layer of semiconductor material, d. said forming said second channel portion of said opposite conductivity type semiconductor material includes diffusing a P+ channel portion through said N-type third layer of semiconductor material and in integral relation with said P-type second layer of semiconductor material, and e. reverse biasing the P-type regions of semiconductor material with respect to the adjacent N-type regions of semiconductor material whereby electrical potentials may be distributed within said P-type and N-type regions of semiconductor material and to the surface of a monolithic integrated structure formed by said layers.

* * * * *